United States Patent [19]

Löhr et al.

[11] Patent Number: 4,985,982
[45] Date of Patent: Jan. 22, 1991

[54] PROCESS AND APPARATUS FOR CUTTING AND TRIMMING PRINTED CIRCUIT BOARD WORKPIECES

[75] Inventors: Hans-Günter Löhr, Wiernsheim; Gunter Herrmann, Cawl; Josef W. Mozzi, Unterreichenbach; Dieter Claus, Rosbach-Rodheim, all of Fed. Rep. of Germany

[73] Assignee: Lohr & Herrmann GmbH, Neuhausen, Fed. Rep. of Germany

[21] Appl. No.: 227,656

[22] Filed: Aug. 3, 1988

[30] Foreign Application Priority Data

Nov. 7, 1987 [DE] Fed. Rep. of Germany ....... 3737868

[51] Int. Cl.⁵ .................... B23C 5/14; B23D 19/08; B23D 33/02
[52] U.S. Cl. .................... 29/566.001; 83/51; 83/471; 83/500; 83/503; 83/861; 144/356; 269/903; 409/132; 409/138; 409/228
[58] Field of Search .............. 83/471, 500, 495, 861; 83/862, 863, 864, 914, 156, 422, 475, 51, 865, 503; 269/903; 51/206 P; 144/239, 356, 223, 220, 188, 235; 409/131, 132, 138, 88, 164, 221, 228, 203, 217

[56] References Cited

U.S. PATENT DOCUMENTS

| | | | |
|---|---|---|---|
| 1,452,252 | 11/1922 | Neal | 83/500 X |
| 3,191,500 | 6/1965 | Schuster | 407/138 |
| 3,468,583 | 9/1969 | Austin | 51/206 P |
| 3,534,656 | 10/1970 | Michelson | 409/138 |
| 3,922,951 | 12/1975 | Linsinger | 409/138 |
| 4,297,930 | 11/1981 | Putzke | 83/156 |
| 4,768,698 | 9/1988 | Brown et al. | 269/903 |

Primary Examiner—Hien H. Phan
Assistant Examiner—Kenneth E. Peterson
Attorney, Agent, or Firm—Dvorak and Traub

[57] ABSTRACT

This invention relates to a process and an apparatus for cutting and trimming printed circuit board workpieces, particularly printed multilayer circuit board workpieces, which are cut to an exactly predetermined, selectable size at high speed in an operation in which the workpieces are subjected only to relatively low stresses. The workpieces are cut and trimmed and are profiled at each of their edges in a single operation. This is accomplished by means of two circular sawblades, which extend in a common plane and have interdigitating sawteeth, which preferably have diamond cutting edges. The interdigitating sawteeth of the two sawblades cut into the workpiece from opposite broadsides and the sawteeth of each of the sawblades penetrate into the workpiece only in part of its thickness. As a result, the circuit board workpiece is cut and trimmed without a formation of burrs and in the same operation is formed with at its edge portion with a profile that is determined by the profile of those side faces of said sawteeth which face said edge portion.

18 Claims, 4 Drawing Sheets

PROCESS AND APPARATUS FOR CUTTING AND TRIMMING PRINTED CIRCUIT BOARD WORKPIECES

BACKGROUND OF THE INVENTION

1. Field of the Invention

This invention relates to a process and apparatus for cutting and trimming printed circuit board workpieces, particularly of multilayer printed circuit workpieces.

2. Description of the Prior Art

In the manufacture of such multilayer printed circuit boards, an outer layer is covered with synthetic resin interlayers and with circuit board inner layers built up in alternation in an operation in which the positions of the various layers are defined by means of suitable locating means, such as locating pins. The printed circuit board workpieces are subsequently compacted under the action of heat and pressure in an operation in which the synthetic resin is rendered flowable and flows outwardly in the plane of the respective layer beyond the contour of the workpiece and when the synthetic resin has been cooled and solidified it constitutes an undefined marginal portion, which varies in width. As printed circuit board workpieces are often cut in a size which exceeds the area which is subsequently utilized, the marginal portion formed by the synthetic resin which has been squeezed out may be confined between the surplus marginal portions of the oversize printed circuit board workpiece.

That marginal portions of the oversize printed circuit board workpiece and the marginal portion formed by the synthetic resin must be removed so that a printed circuit board having exactly the required size will be obtained. The trimmed multilayer board from which the marginal portions have been removed should be free of burrs and must be profiled at its edges so that the further processing will not result in defects caused by loose particles or sharp edges. In known processes this is accomplished in that the marginal portion is cut off by means of impact cutters or rotary cutters. It is also known to use milling machines, in which the milling cutting is moved along the fixed printed circuit board workpiece to form the latter with the desired contour. Said processes have the disadvantage that the edge portions are not finish-machined. In some of said known processes, the printed circuit board workpieces are subjected to high stresses. Besides, the machining speed is often very low and the thickness of the printed circuit boards which can be machined is limited.

SUMMARY OF THE INVENTION

It is an object of the invention to provide a process which can be performed to cut and trim multilayer printed circuit board workpieces in different sizes as well as single-layer printed circuit board workpieces at a high speed exactly to a predetermined size in such a manner that the trimmed workpieces will be free of burrs, high stresses on the workpieces will be avoided and each edge portion of the printed circuit board workpieces will be profiled in the same operation.

It is another object of the invention to provide an apparatus for carrying out such process.

It is a further object of the invention to provide such an apparatus which can easily and quickly be adapted to the making of printed circuit boards having a different size.

In a process of cutting and trimming printed circuit board workpieces, the first object mentioned hereinbefore is accomplished in accordance with the invention in that two circular sawblades extending in a common plane and having interdigitating sawteeth formed with a profiled side face on one side of said sawblades are rotated in mutually opposite senses to cut into mutually opposite broadsides of a printed circuit board workpiece having a given thickness and extending through said plane in such a manner that the sawteeth of each of said sawblades cut into said workpiece only in part of its thickness. As a result, a marginal portion is severed from said workpiece on the opposite side of said sawblades and the remaining part of said workpiece disposed on said one side of said sawblades is trimmed and is formed with an edge portion having a profile which is complementary to said profiled side face.

In an apparatus for cutting and trimmming printed circuit board workpieces, particularly of multi-layer printed circuit board workpieces, the second object mentioned hereinbefore is accomplished in accordance with the invention by the provision of two circular sawblades, which extend in a common plane and are preferably provided with diamond cutting edges and have interdigitating sawteeth, which are operable to penetrate into the printed circuit boards from opposite broad sides and to cut through the printed circuit board without a formation of burrs and to trim the blanked printed circuit board and to form the edges of the printed circuit board with a profile that is complementary to the adjacent profiled side faces of the sawteeth, whereas each of said circular sawblades does not cut in itself through the printed circuit board in its entire thickness.

In accordance with the invention an apparatus for cutting and trimming printed circuit board workpieces comprises two circular sawblades, which extend in a common plane and have interdigitating sawteeth formed with a profiled side face on one side of said sawblades, sawblade drive means for rotating said sawblades in mutually opposite senses, and feeding means for moving a printed circuit board workpiece, on the one hand, and said sawblades, on the other hand, relative to each other so that said workpiece extending through said plane is moved between said sawblades while said sawblades are rotated in mutually opposite senses to cut into mutually opposite broadsides of a printed circuit board workpiece having a given thickness and extending through said plane in such a manner that the sawteeth of each of said sawblades cut into said workpiece only in part of its thickness, whereby a marginal portion is severed from said workpiece on the opposite side of said sawblades and the remaining part of said workpiece disposed on said one side of said sawblades is trimmed and is formed with an edge portion having a profile which is complementary to said profiled side face.

For that purpose each printed circuit board workpiece is placed in a horizontal orientation on a fixing plate, which is detachably mounted on an indexable turntable, and the workpieces are located on said fixing plate by means of locating pins or other locating means which have been used in the manufacture of the workpiece. That fixing plate is smaller by a few millimeters in width and length than the printed circuit board having the desired size so that the edge portion which is to be trimmed protrudes from the fixing plate. The indexable turntable is mounted on a compound table, which is movable in two mutually orthogonal directions by respective motors, which are controllable as regards the position and velocity of said compound table and which permit the workpiece to be moved at high speed in either direction. By means of the compound table the fixed workpiece is moved exactly in a predetermined position between two circular sawblades, which have specially profiled, diamond cutting edges. In a first operation, the workpiece is cut to form one edge portion of the printed circuit board and with a profile that is determined by the side faces of the teeth.

In order to ensure that no burr will be formed by the sawing operation, each sawable penetrates the workpiece only in part of its thickness so that neither of the circular sawblades will cut through the entire thickness of the workpiece. Particularly with workpieces covered by copper foils, such a penetration of one sawblade through the workpiece in its entire thickness would cause a large burr to be formed on the workpiece on that broadside which is opposite to that which is first entered by such sawblade. A cutting through the entire thickness of the workpiece is accomplished in that the two sawblades penetrate the workpiece from mutually opposite broadsides. The two sawblades are installed in the apparatus in such a manner that the sawteeth of those portions of the sawblades which are adjacent to each other interdigitate without contacting each other and have cutting edges facing generally in the same direction. In those interdigitating portions of the sawblades, each sawtooth of one sawblade extends into a tooth space of the other sawblade. A contact between the interdigitating teeth of the two sawblades can reliably be avoided only in that the two sawblades are driven in synchronism. This can be ensured, e.g., by a rigid connection between the two sawblades, e.g., by means of cogged vee belts or gears.

The marginal portion which has been cut off is received between two pinch rollers, which are driven at a surface speeed that is equal to the velocity of the compound table and convey said cut-off marginal portion away from the sawblades. When the workpiece has been trrimmed along its first edge, the indexable turntable is operated to rotate the workpiece through 90° and the workpiece is then moved between the two sawblades a second time. That sequence is repeated two more times so that a printed circuit board is finally obtained which has been trimmed and profiled at all four edges and is free of burrs at said edges. The sequence of operations and the positioning of the workpiece may be controlled by computerized numerical control (CNC), which permits a simple adaptation of the operations of the machine to the size of the desired printed circuit board.

DETAILED DESCRIPTION OF THE PREFERRED EMBODIMENT

Figure 1:
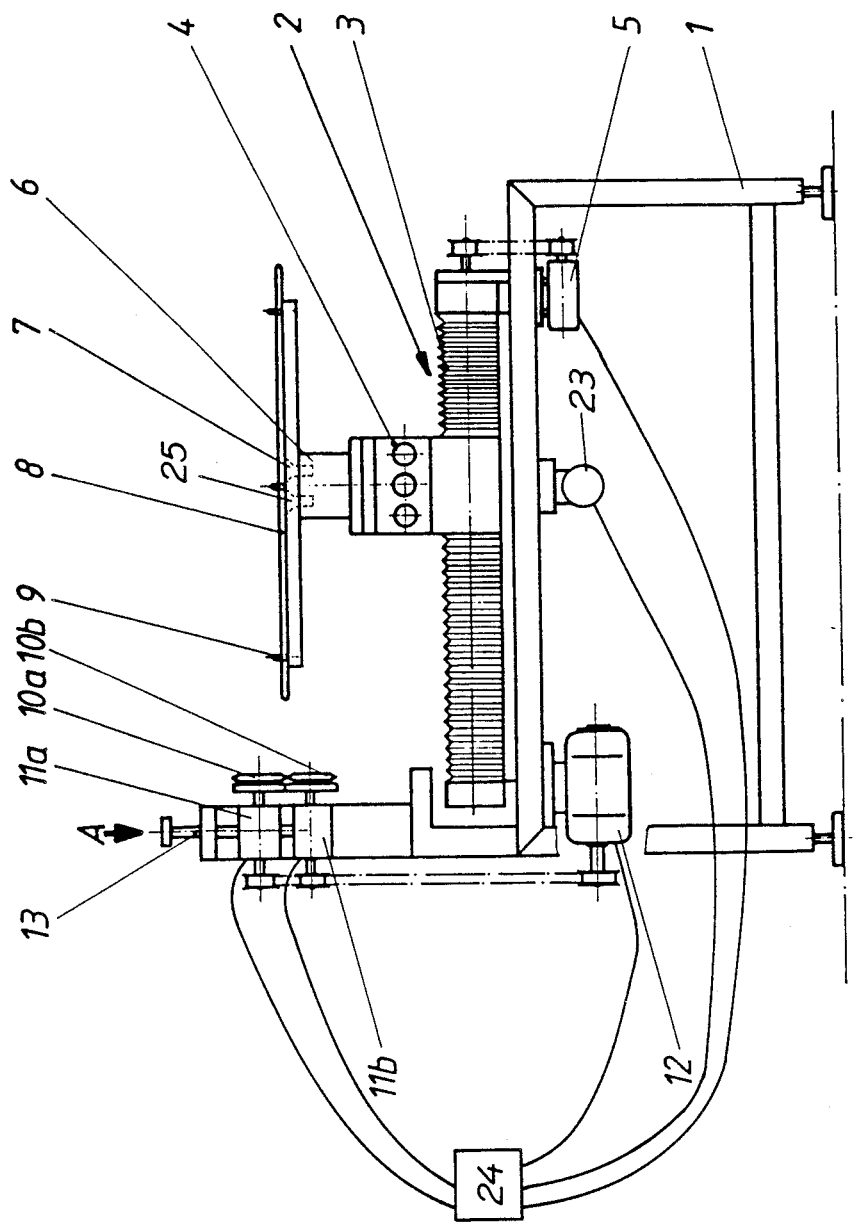
FIG. 1 is a diagrammatic side elevation showing the entire apparatus.

A preferred embodiment of an apparatus in accordance with the invention will now be explained more in detail with reference to the drawing.

It is apparent from FIG. 1 that a base frame 1 supports a compound table 2, which has elements 3 and 4 which are movable in two mutually orthogonal directions X and Y, respectively. The drive means 5 for moving the element 3 in the direction X and the drive means 23 for moving the element 4 in the direction Y also apparent. An indexable truntable 6 is mounted on that element 4 of the compound table 2 which is movable in the direction Y. A fixing plate 7 is secured by screws 25 to the turntable 6. The printed circuit board workpiece 8 lies on the fixing plate 7 and is thus supported on the indexable turntable 6 and is fixed in position by locating means 9. The two sawblades 10a and 10b are rotatably mounted in bearing brackets 11a and 11b and are driven by a motor 12 via a common cogged vee belt, which establishes a positive connection between the two sawblades. The bearing brackets 11a and 11b are adjustable by means of an adjusting screw 13 for adaptation to different sawblades, and to circuit board workpieces which differ in thickness. A computerized numerical control system 24 controls the cutting and trimming operations.

Figure 2:
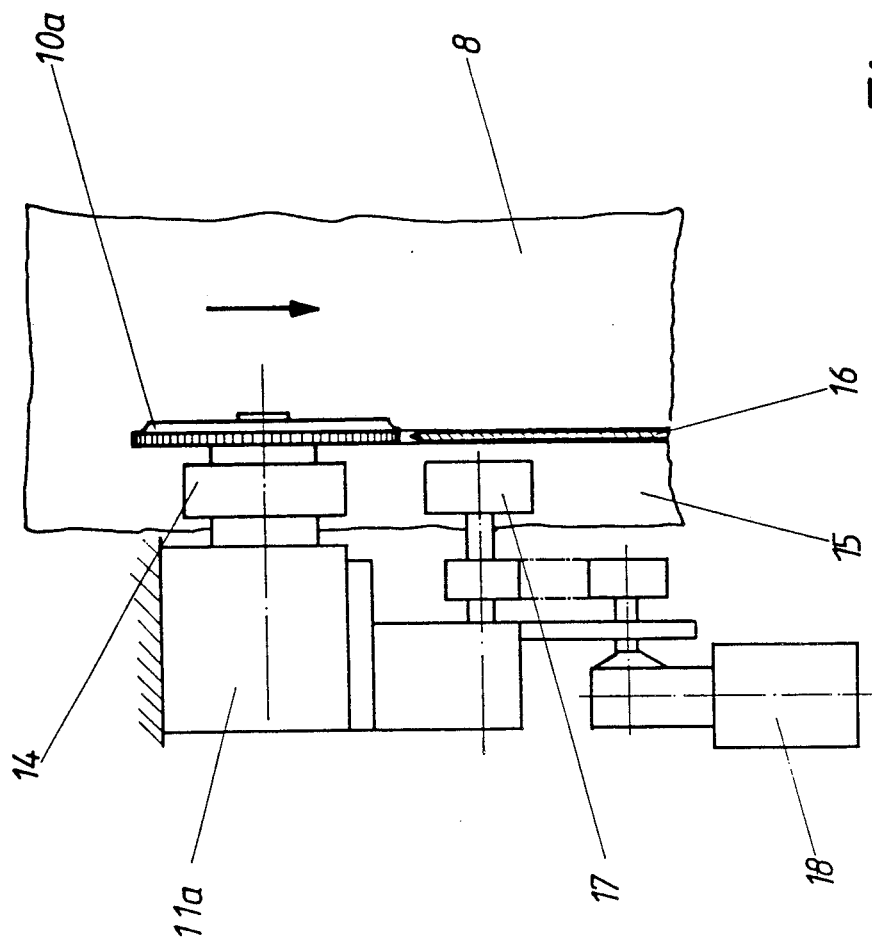
FIG. 2 is a fragmentary top plan view showing the detail A in FIG. 1 with the interdigitating sawblades.

FIG. 2 is a fragmentary top plan view showing the detail A of FIG. 1. The circuit board workpiece 8 is a position in which it is being trimmed by means of the circular sawblades 10a and 10b. As the circuit board workpiece 8 is trimmed, it is centered by means of two pinch rollers 14, which lie one over the other. The marginal portion 15 which has been cut from the circuit board workpiece 8 is positively served by a sword 16 from the remaining circuit board and is transported away from the sawblades 10a, 10b by two pinch rollers 17, which are arranged one over the other and are driven by a flange mounted motor 18. When the marginal portion has entirely been severed it falls laterally out of the apparatus.

Figure 3:
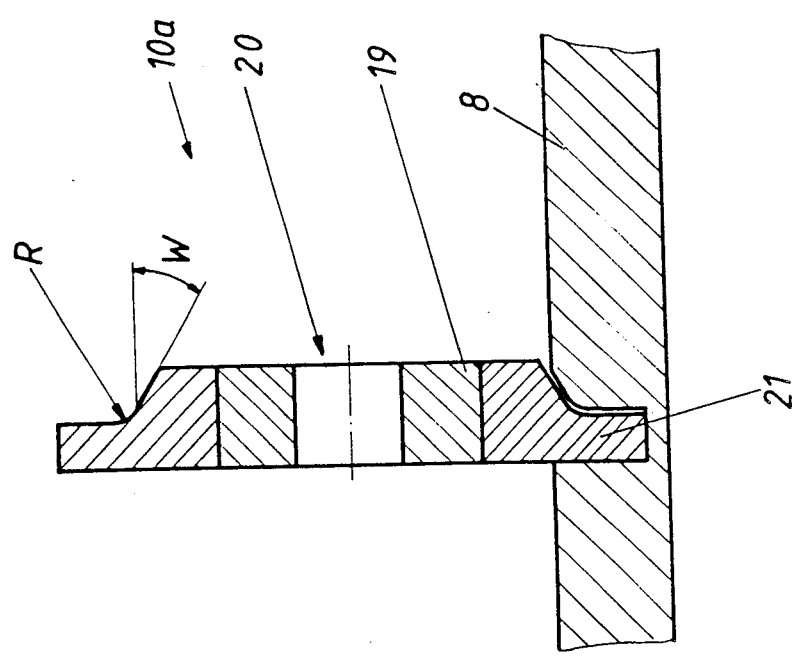

FIG. 3 shows one of the two sawblades 10a as it cuts into the workpiece 8. It is apparent that the sawblades 10a comprises a body 19, which is mounted on a shaft, not shown, that is fixed in an axial bore 20 of the body 19. The body 19 is provided on its periphery with a pluarality of sawteeth 21 having diamond cutting edges. The sawteeth 21 are so shaped that they can cut into the workpiece 8 and profile the edge portion of the circuit board 8 in a single operation. This is ensured in that the sawteeth 21 have on one side a curved surface having a radius R and increase in thickness toward the center of the sawblade so that they have a surface portion extending at a slectable angle W to the axis of rotation.

Figure 4:
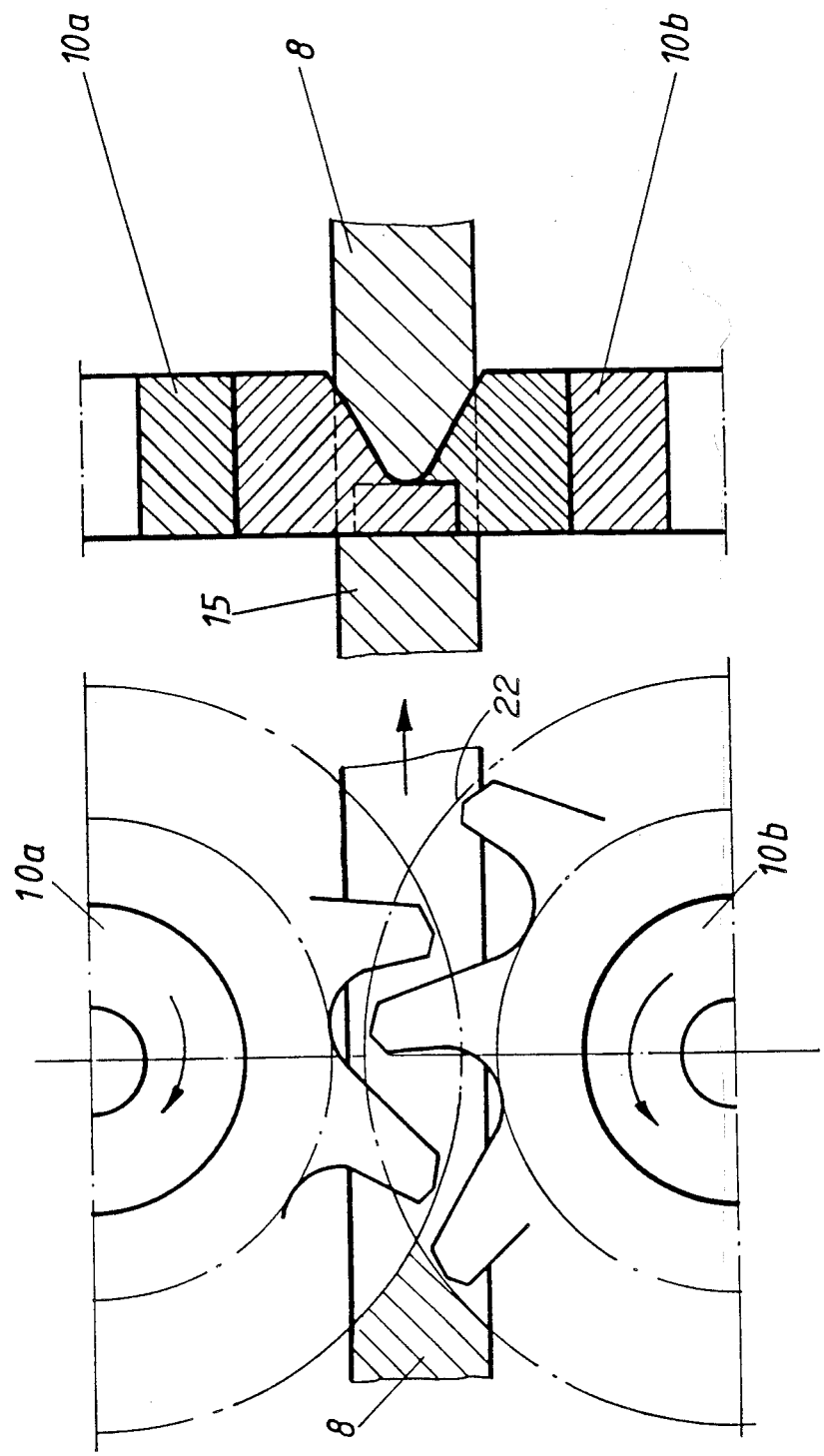
FIG. 3 is a transverse sectional view illustrating one of the sawblades cutting into the workpiece and FIG. 4 is a top plan view and a transverse sectional view showing the two interdigitating sawblades cutting into the workpiece.

FIG. 4 is a fragmentary transverse sectional view and a fragementary side elevation showing the interdigitating sawblades 10a and 10b, each having diamond cutting edges 22 cutting into the printed circuit board workpiece 8. It is apparent that each sawblade 10a or 10b penetrates into the workpiece 8 only in part of its depth and that the edge of the printed circuit board is cut, trimmed and profiled in a single operation.

We claim:

1. A process of cutting and trimming printed circuit board workpieces, wherein
   two circular sawblades extending in a common plane and having interdigitating sawteeth formed with a profiled side face on one side of said sawblades are rotated in mutually opposite senses to cut into mutually oppposite broadsides of a printed circuit board workpiece having a given thickness and extending through said plane in such a manner that the sawteeth of each of said sawblades cut into said workpiece only in part of its thickness, whereby a marginal portion is severed from said workpiece on the opposite side of said sawblades and a remaining part of said workpiece disposed on said one side of said sawblades is trimmed and is formed with an edge portion having a profile which is complementary to said profiled side face.

2. The process set forth in claim 1 as applied to the cutting and trimming of multilayer printed circuit board workpieces.

3. The process set forth in claim 1 as applied to the cutting and trimming of circuit board workpieces so that said remaining parts of said workpieces differ in sizes, wherein said process is controlled by a computerized numerical conrol which is programmed in dependence on the size of said remaining part of said workpiece.

4. The process set forth in claim 1, wherein a contact between said interdigitating sawteeth of said two sawblades is prevented.

5. The process set forth in claim 4, wherein said two sawblades are rotated in synchronism with each other.

6. An apparatus for cutting and trimming printed circuit board workpieces, comprising two circular sawblades, which extend in a common plane and have interdigitating sawteeth formed with a profiled side face on a first side of said sawblades, sawblade drive means for rotating said sawblades in mutually opposite senses, and feeding means for moving a printed circuit board workpiece and said sawblades, relative to each other so that said workpiece extending through said plane is moved between said sawblades while said sawblades are rotated in mutually opposite senses to cut into mutually opposite broadsides of a printed circuit board workpiece having a given thickness and extending through said plane in such a manner that the sawteeth of each of said sawblades cut into said workpiece only in part of its thickness, whereby a marginal portion is severed from said workpiece on a second side of said sawblades and a remaining part of said workpiece disposed on said one side of said sawblades is trimmed and is formed with an edge portion having a profile which is complementary to said profiled side face.

7. The apparatus set forth in claim 6, wherein said sawteeth of said two sawblades interdigitate without contacting each other.

8. The apparatus set forth in claim 6, wherein said feeding means comprise a detachably mounted fixing plate for supporting said workpiece in such a position that said remaining part of said workpiece slightly protrudes from said fixing plate.

9. The apparatus set forth in claim 6, wherein said sawblade drive means are stationary and operable to rotate said sawblades in synchronism and said feeding means are adapted to support and operable to move said workpiece extending through said plane between said sawblades.

10. The apparatus set forth in claim 9, which comprises pinch rollers for transporting said marginal portion which has been severed away from said sawblades and roller drive means for driving said pinch rollers in synchronism with said feeding means.

11. The apparatus set forth in claim 9, wherein said feeding means comprise a detachably mounted fixing plate for supporting said workpiece and said feeding means are operable to move said workpiece extending through said plane between said sawblades in such a manner that said fixing plate is clear of said plane.

12. The apparatus set forth in claim 11, which comprises two pinch rollers, which lie one over the other and are arranged to center said workpiece supported by said fixing plate.

13. The apparatus set forth in claim 11, wherein said fixing plate is provided with means for locating said workpiece on said fixing plate.

14. The apparatus set forth in claim 11, wherein said feeding means comprise an indexable turntable, on which said fixing plate is detachably mounted.

15. The apparatus set forth in claim 14, wherein said feeding means comprise a compound table having first and second elements which are movable in two mutually orthogonal directions, and two motors are provided, which are operable to move respective ones of said elements in respective ones of said mutually orthogonal directions and are controlled as regards the positions and velocities of said elements.

16. The apparatus set forth in claim 11, wherein said fixing plate is provided with means for locating said workpiece on said fixing plate.

17. The apparatus set forth in claim 6, wherein a computerized numerical control system is provided for the control of said apparatus and is programmable for the making of said remaining parts in different sizes.

18. The apparatus set forth in claim 6, wherein said sawteeth have diamond cutting edges.

* * * * *